United States Patent
Fischer et al.

(10) Patent No.: US 8,220,148 B2
(45) Date of Patent: Jul. 17, 2012

(54) METHOD FOR PRODUCING A FLEXIBLE CONDUCTOR CARRIER AND ARRANGEMENT COMPRISING THE FLEXIBLE CONDUCTOR CARRIER

(75) Inventors: Georg Fischer, Regensburg (DE); Josef Loibl, Bad Abbach (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 697 days.

(21) Appl. No.: 12/374,118

(22) PCT Filed: May 14, 2007

(86) PCT No.: PCT/EP2007/054651
§ 371 (c)(1),
(2), (4) Date: Jan. 30, 2009

(87) PCT Pub. No.: WO2008/009493
PCT Pub. Date: Jan. 24, 2008

(65) Prior Publication Data
US 2010/0012355 A1    Jan. 21, 2010

(30) Foreign Application Priority Data
Jul. 18, 2006 (DE) .......................... 10 2006 033 269

(51) Int. Cl.
*H05K 3/28* (2006.01)
*H05K 1/14* (2006.01)

(52) U.S. Cl. ............. 29/848; 29/846; 174/254; 174/251

(58) Field of Classification Search .................... 29/846, 29/847, 85, 850; 174/254, 65 R, 50, 50.61, 174/50.62, 151
See application file for complete search history.

(56) References Cited

U.S. PATENT DOCUMENTS

| 4,560,826 | A | * | 12/1985 | Burns et al. ................ | 174/50.51 |
| 4,716,259 | A |   | 12/1987 | Tokura et al. | |
| 5,273,203 | A | * | 12/1993 | Webster ..................... | 228/124.6 |
| 5,280,413 | A | * | 1/1994 | Pai ............................... | 361/792 |
| 5,450,286 | A |   | 9/1995 | Jacques et al. | |
| 6,221,229 | B1 |  | 4/2001 | Heerman et al. | |

(Continued)

FOREIGN PATENT DOCUMENTS

DE    10100823 C1    2/2002
(Continued)

OTHER PUBLICATIONS

German Office Action dated Apr. 25, 2007.
(Continued)

*Primary Examiner* — Derris Banks
*Assistant Examiner* — Kaying Kue
(74) *Attorney, Agent, or Firm* — Laurence A. Greenberg; Werner H. Stemer; Ralph E. Locher

(57) ABSTRACT

A method for producing a first flexible conductor carrier includes applying at least one conductor track to a base insulating film. A covering layer is applied to the conductor track and the base insulating film in such a way that, in at least one conduction region of the first flexible conductor carrier, the conductor track is completely enclosed by the covering layer and the base insulating film. The base insulating film is free of the conductor track and the covering layer in at least one insulating region. The conductor track is free of the covering layer in at least one contact region of the first flexible conductor carrier.

6 Claims, 2 Drawing Sheets

U.S. PATENT DOCUMENTS

| | | | |
|---|---|---|---|
| 6,239,370 B1 * | 5/2001 | Loibl et al. | 174/666 |
| 6,300,566 B1 | 10/2001 | Scheuerer et al. | |
| 6,426,143 B1 * | 7/2002 | Voss et al. | 428/378 |
| 6,727,116 B2 * | 4/2004 | Poo et al. | 438/106 |
| 7,115,984 B2 * | 10/2006 | Poo et al. | 257/698 |
| 7,364,799 B2 * | 4/2008 | Kurita et al. | 428/477.7 |
| 7,728,102 B2 * | 6/2010 | Kurita et al. | 528/310 |
| 7,952,885 B2 * | 5/2011 | Loibl et al. | 361/749 |
| 8,004,849 B2 * | 8/2011 | Hauer et al. | 361/749 |
| 2006/0208351 A1 * | 9/2006 | Poo et al. | 257/693 |
| 2008/0108478 A1 | 5/2008 | Wetzel et al. | |
| 2008/0156511 A1 * | 7/2008 | Hauer et al. | 174/50.5 |
| 2009/0002959 A1 * | 1/2009 | Loibl et al. | 361/749 |
| 2009/0016034 A1 * | 1/2009 | Beer et al. | 361/752 |

FOREIGN PATENT DOCUMENTS

| | | |
|---|---|---|
| DE | 102004021931 A1 | 10/2005 |
| GB | 1254281 A | 11/1971 |
| JP | 63268292 A | 11/1988 |
| JP | 2183589 A | 7/1990 |
| JP | 7038239 A | 2/1995 |
| JP | 63181498 A | 7/1998 |
| JP | 2004207704 A | 7/2004 |
| WO | 9841070 A1 | 9/1998 |
| WO | 2006066983 A1 | 6/2006 |

OTHER PUBLICATIONS

International Search Report dated Aug. 24, 2007.

* cited by examiner

METHOD FOR PRODUCING A FLEXIBLE CONDUCTOR CARRIER AND ARRANGEMENT COMPRISING THE FLEXIBLE CONDUCTOR CARRIER

BACKGROUND OF THE INVENTION

Field of the Invention

Electronic control elements are frequently arranged in motor vehicles on a decentralized basis. For example, in an automatic transmission for motor vehicles the corresponding control electronics and the associated sensor system can be incorporated into the gearbox of the automatic transmission. Similar trends toward "in-situ electronics" also exist in other regions of vehicles, for example in the case of motor control units and brake systems. Because space is limited, flexible conductor carriers are especially well suited for distributing electronic signals and currents. Such conductor carriers frequently consist of two polyimide films, between which conductive copper tracks are embedded.

If for example such a conductor carrier is built into the gearbox, non-insulated contact points of the conductor carrier must be sealed against particles in the ambient medium, for example oil. If one of the particles penetrates into the region of the non-insulated contact point of the conductor carrier, a short-circuit may occur and thus the control electronics, which include the conductor carrier, may be disrupted and/or damaged.

BRIEF SUMMARY OF THE INVENTION

The object of the invention is to create a simple, low-cost method for producing a flexible conductor carrier.

The invention is characterized according to a first aspect of the invention by a method for producing a first flexible conductor carrier. At least one conductor track is applied to the base insulating film. A covering layer is applied to the conductor track and the base insulating film such that in at least one conduction region of the first flexible conductor carrier the conductor track is completely enclosed by the covering layer and the base insulating film, that in at least one insulating region the base insulating film is free of the conductor track and the covering layer and that in at least one contact region of the first flexible conductor carrier the conductor track is free of the covering layer.

This makes it possible to apply the covering layer solely in the region of the conductor tracks. This helps to save on material costs for the covering layer. Exposing the contact region renders further method steps for the production of the contact region superfluous. Furthermore, it is possible to dispense with bonding the covering layer, for example using an acrylic adhesive. This contributes to a simple, low-cost production of the flexible conductor carrier.

In an advantageous embodiment of the first aspect of the invention, the covering layer is applied in at least one sealing region such that the first flexible conductor carrier in the sealing region of the first flexible conductor carrier has the same thickness as in the conduction region with conductor track. If a section of the flexible conductor carrier is sealed off from another section of the flexible conductor carrier, no gaps are formed between a sealing body for partitioning off the section and the flexible conductor carrier in the sealing region. The sealing region thus helps to seal the sections off from one another simply and especially well.

In another advantageous embodiment of the first aspect of the invention the covering layer is formed by screen printing processes. This enables the covering layer to be produced simply and at low cost.

The invention is characterized according to a second aspect of the invention by an arrangement with the first flexible conductor carrier. The arrangement further includes a baseplate and a sealing body. The base insulating film is arranged on the baseplate such that the covering layer faces away from the baseplate. The sealing body seals off a section, which includes the contact region, of the first flexible conductor carrier from the surroundings. The sealing body is embodied and arranged such that an edge of the sealing body is merely connected to the first flexible conductor carrier in the sealing region of the first flexible conductor carrier. The sealing region and the connection of the sealing body to the sealing region contribute effectively to opportunely sealing off the section from the surroundings.

In an advantageous embodiment of the second aspect of the invention the arrangement includes a second flexible conductor carrier, which was produced in the same manner as the first flexible conductor carrier. The second flexible conductor carrier is arranged next to the first flexible conductor carrier on the baseplate. The sealing region extends at least partially over the baseplate and the second flexible conductor carrier, so that the covering layer in the sealing region has the same elevation in respect of the baseplate as in the conduction region. The sealing region and the connection of the sealing body to the sealing region beyond the first flexible conductor carrier contributes effectively to sealing the section off from the surroundings especially opportunely.

In a further advantageous embodiment of the second aspect of the invention a seal is formed between the edge of the sealing body and the sealing region. This is a simple way of ensuring that the section is sealed off especially well.

BRIEF DESCRIPTION OF THE SEVERAL VIEWS OF THE DRAWING

The invention is explained in greater detail below on the basis of schematic drawings.

The drawings show.

DESCRIPTION OF THE INVENTION

Figure 1:
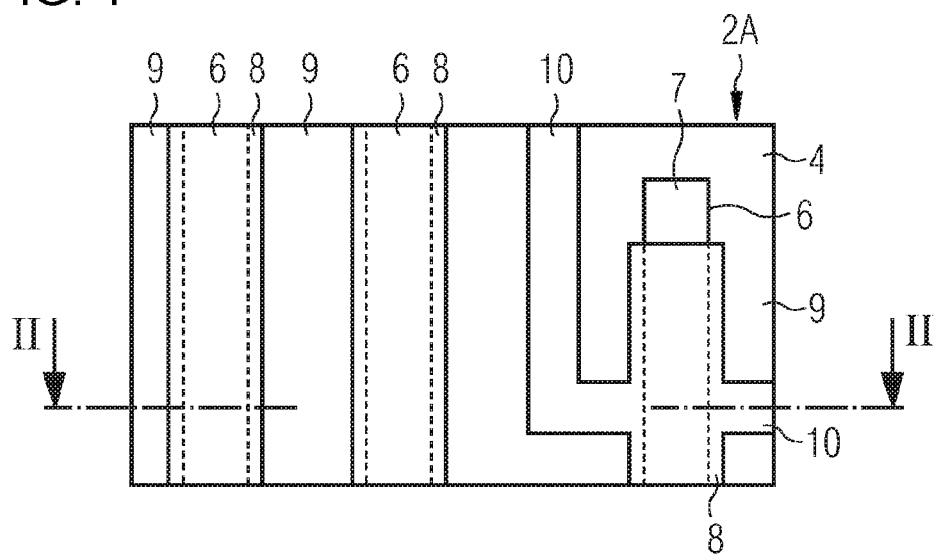
FIG. 1 a flexible conductor carrier.

Elements with the same design or function are characterized with the same reference characters in all the figures.

A first flexible conductor carrier 2A (FIG. 1) includes a base insulating film 4, at least one, preferably a plurality of conductor tracks 6 and a covering layer. The base insulating film 4 preferably includes polyimide. The conductor tracks 6 preferably include copper. The covering layer can for example include fluorosilicone.

The conductor tracks 6 are permanently connected to the base insulating film 4. The covering layer is applied to the base insulating film 4 and the conductor tracks 6 such that the conductor tracks 6 are completely enclosed by the covering layer and the base insulating film 4 except for at least one contact region 7.

Figure 2:
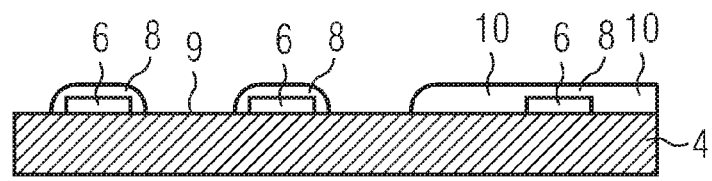
FIG. 2 a section through the flexible conductor carrier according to FIG. 1, FIG. 3 a flow chart for producing the flexible conductor carrier, FIG. 4 the flexible conductor carrier on a baseplate, FIG. 5 a plurality of flexible conductor carriers on the baseplate.

Furthermore, the covering layer can be applied to the base insulation film 4 in a sealing region 10 independently of the conductor track 6, so that in the sealing region 10 the first flexible conductor carrier 2A has the same thickness as in the conduction region 8 on the conductor track 6 (FIG. 2).

In an insulating region 9 the first flexible conductor carrier 2A merely has the base insulating film 4. The insulating region 9 insulates the conductor tracks 6 from one another. The absence of the covering layer in the insulating region 9 helps to save material for the covering layer. This contributes to enabling the first flexible conductor carrier to be produced especially opportunely.

Figure 3:
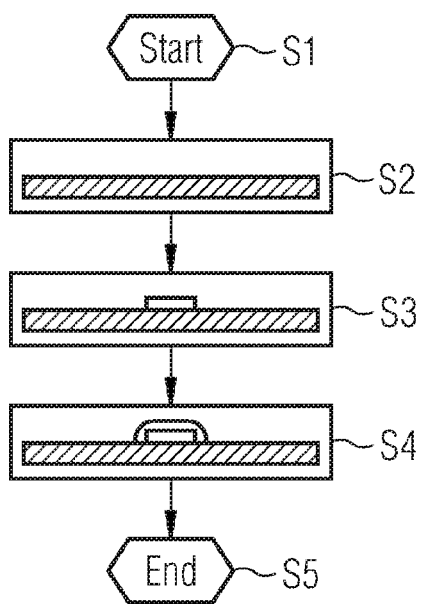

A production process for producing the first flexible conductor carrier 2A is preferably started in a step S1 (FIG. 3). In step S1 for example the materials and the equipment for production of the first flexible conductor carrier 2A can be prepared.

In a step S2 the base insulating film 4 is arranged and aligned in one of the pieces of equipment for producing the first flexible conductor carrier 2A.

In a step S3 the conductor tracks 6 are applied to the base insulating film. For example, a layer of rolled copper can be bonded to the base insulating film 4. The conductor tracks 6 can then be formed from the layer of rolled copper using a photo-exposure process and a subsequent etching process. Furthermore, the first flexible conductor carrier 2A can be dried and/or cleaned in step S3 following on from the etching process.

In a step S4 the covering layer is applied. The covering layer is preferably applied to the first flexible conductor carrier 2A using screen printing processes. In the screen printing process the meshes in the region of which no covering layer is to be applied to the flexible conductor carrier are blocked off in a screen. The material of the covering layer is then pressed through the screen in a viscous state by means of a squeegee. The screen printing process enables the same thickness of the first flexible conductor carrier 2A to be produced in simple manner in the conduction region 8 and in the sealing region 10. Furthermore, the insulating region 9 and the contact region 7 can be formed especially simply by blocking off the corresponding meshes of the screen.

Compared to a known production process, in which instead of the covering layer a covering film, for example a polyimide film, is applied to the entire first flexible conductor carrier 2A, the inventive production process has the advantage that the covering layer is applied only in the conduction region 8 and the sealing region 10. Compared to applying the covering layer to the entire first flexible conductor carrier this saves material. Furthermore, in the known production process, cutouts from the covering film must be stamped out after applying the covering film, so that the conductor tracks 6 can be contacted.

The production process can be terminated in a step S5. Alternatively, the first flexible conductor carrier 2A can be permanently arranged on a baseplate 12. For example, the first flexible conductor carrier 2A can be laminated to the baseplate 12. The baseplate 12 is used to dissipate heat quickly that occurs during operation of the first flexible conductor carrier 2A. Hence the baseplate 12 preferably includes aluminum.

Figure 4:
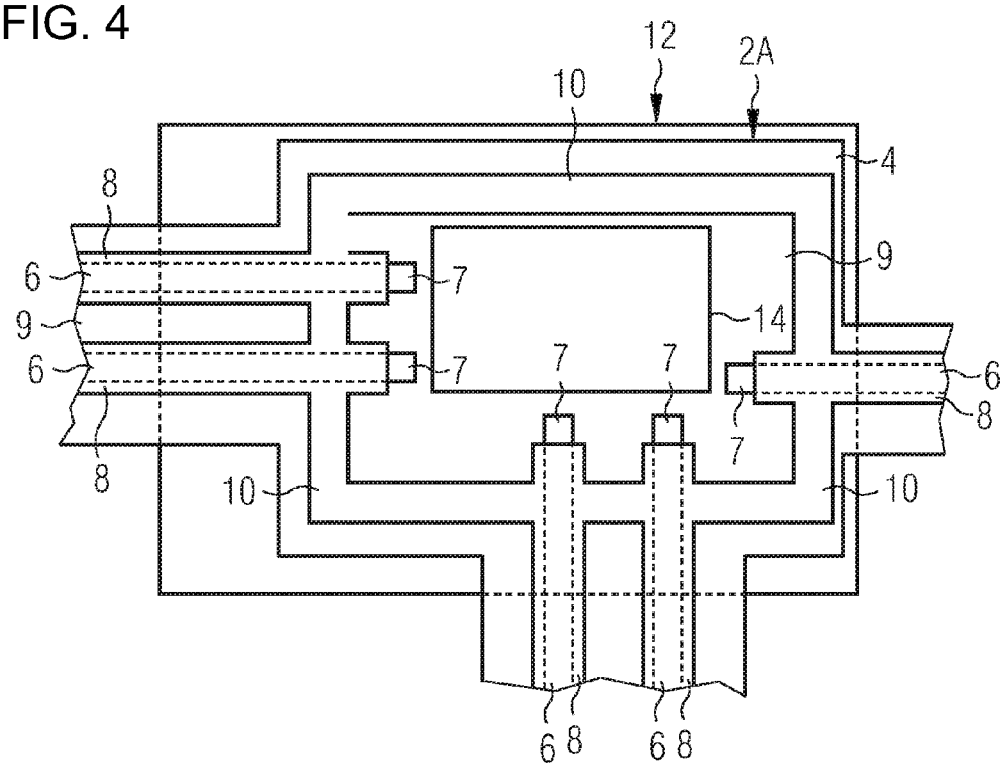

An arrangement (FIG. 4) with the first flexible conductor carrier 2A includes the baseplate 12. The baseplate 12 can have a cutout 14 from the baseplate 12 for introduction of an electronic circuit. The first flexible conductor carrier 2A then preferably likewise has a cutout from the first flexible conductor carrier 2A in the same region. The sealing region 10 encloses, together with sections of the conduction region 8, for example, the cutout 14 from the baseplate 12 and preferably the contact regions 7 of the first flexible conductor carrier 2A. After introducing the electronic circuit into the cutout 14 from the baseplate a sealing body, for example a cover whose edge has the same shape as the sealing region 10, can be placed in a simple manner on the arrangement. Thus the edge of the sealing body seals off the section inside the sealing region 10 from the surroundings, without leaving a gap between the edge of the sealing body and the sealing region 10.

Alternatively or in addition to the sealing region 10, a seal can be arranged between the edge of the sealing body and the first flexible conductor carrier 2A. The seal can for example be a simple rubber seal. However, the seal can also be sprayed onto the edge of the sealing body or onto the first flexible conductor carrier 2A, applied using a dispensing method or formed by applying an adhesive bead, made of fluorosilicone for example.

Figure 5:
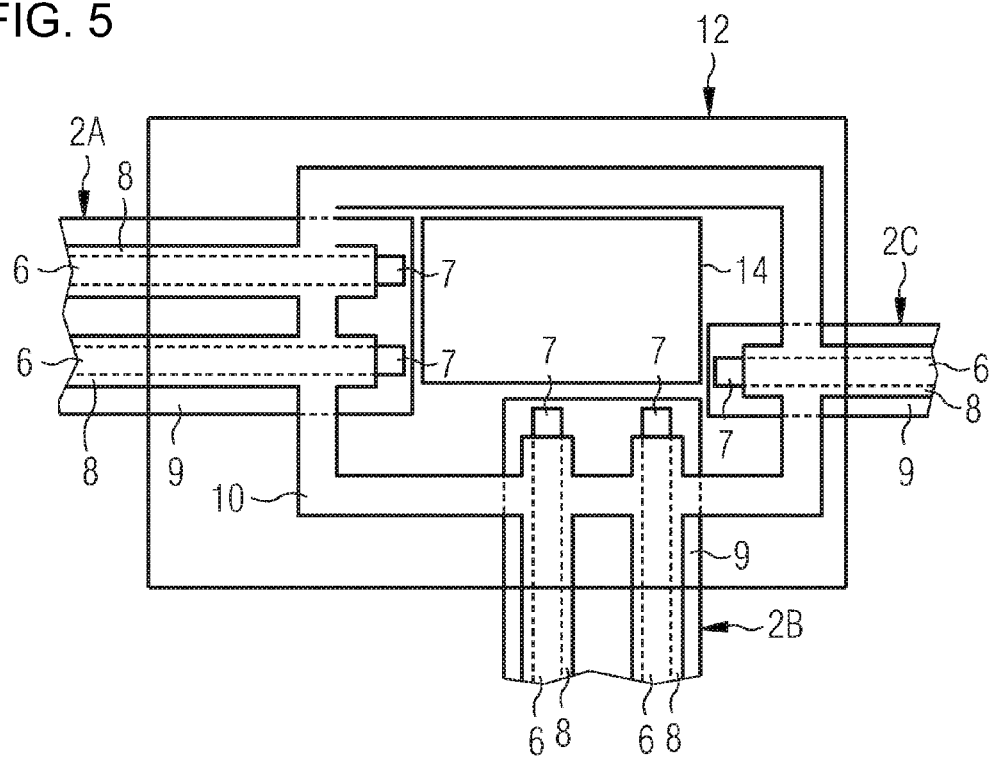

Alternatively or in addition, a second flexible conductor carrier 2B and/or a third flexible conductor carrier 2C can be fixed to the baseplate 12 (FIG. 5). In this connection it is advantageous if the covering layer is not applied to the flexible conductor carrier until the base insulating film 4 of the flexible conductor carriers is applied to the baseplate 12 and the conductor tracks 6 are applied to the base insulating film 4. The covering layer is then preferably applied to the arrangement such that the sealing region also extends outside the flexible conductor carrier on the baseplate 12. Preferably the sealing region 10 outside the flexible conductor carrier is applied to the baseplate 12 such that in respect of the baseplate the sealing region has the same elevation as in the conduction regions 8 of the flexible conductor carriers. As a result, no gap is formed between the edge of the sealing body and the sealing region 10. This helps to ensure in an especially simple manner that the arrangement of the flexible conductor carriers is very opportune and especially tight.

The invention is not restricted to the specified exemplary embodiments. For example, the sealing region 10 and the conduction region 8 can be provided with the covering layer in the same work step. Alternatively, the conduction region 8 and the sealing region 10 can be coated with the covering layer of the same or different material one after the other. Furthermore, an alternative method for applying the covering layer can be used. Furthermore, any number of flexible conductor carriers of any shape can be produced using the inventive production method. Furthermore, the baseplate 12 can be produced with or without a cutout 14 from the baseplate 12. Furthermore, the base insulating film 4 and/or the covering layer can include any insulating materials. Furthermore, the conductor tracks 6 can include any conductive materials. Furthermore, the method steps of the method for producing the conductor carriers can be executed at least in part in a different order. For example, the base insulating film 4 can be applied to the baseplate 12 first. Then the conductor tracks 6 can be applied to the base insulating film 4.

The invention claimed is:

1. A method for producing a first flexible conductor carrier, the method comprising the following steps:
    applying at least one conductor track to a surface of a base insulating film and applying a covering layer to the conductor track and to the surface of the base insulating film to provide:
    at least one conduction region of the first flexible conductor carrier in which the conductor track is completely enclosed by the covering layer and the base insulating film;

at least one insulating region in which the surface of the base insulating film is free of the conductor track and the covering layer; and at least one contact region of the first flexible conductor carrier in which the surface of the conductor track is free of the covering layer.

2. The method according to claim 1, which further comprises applying the covering layer in at least one sealing region to provide the first flexible conductor carrier with the same thickness in the sealing region as in the conduction region with the conductor track.

3. The method according to claim 1, which further comprises forming the covering layer by using screen printing processes.

4. An assembly, comprising:
the first flexible conductor carrier produced by the method according to claim 1;
a baseplate on which the base insulating film is disposed with the covering layer facing away from the baseplate; and
a sealing body sealing off a section of the first flexible conductor carrier from the surroundings, the section including the contact region, and the sealing body being formed and disposed with an edge of the sealing body connected to the first flexible conductor carrier only in the sealing region of the first flexible conductor carrier.

5. The assembly according to claim 4, which further comprises:
a second flexible conductor carrier produced by the method according to claim 1 and disposed on the baseplate next to the first flexible conductor carrier;
the sealing region extending at least partially over the baseplate and the second flexible conductor carrier, with the covering layer having the same elevation in the sealing region relative to the baseplate as in the conduction region.

6. The assembly according to claim 4, which further comprises a seal formed between the edge of the sealing body and the sealing region.

* * * * *